United States Patent [19]

Kimura et al.

[11] Patent Number: 4,886,777

[45] Date of Patent: Dec. 12, 1989

[54] PROCESS FOR PREPARING COMPOUND METAL OXIDES

[75] Inventors: Etsuji Kimura, Kasukabe; Nozomu Hasegawa, Omiya; Yutaka Nishiyama, Kagawa, all of Japan

[73] Assignee: Mitsubishi Kinzoku Kabushiki Kaisha, Tokyo, Japan

[21] Appl. No.: 226,876

[22] Filed: Aug. 1, 1988

[30] Foreign Application Priority Data

Jul. 31, 1987 [JP] Japan .................................. 62-190200

[51] Int. Cl.$^4$ ................................................ C01G 3/00
[52] U.S. Cl. ........................................ 505/1; 423/593; 423/604; 423/636; 423/639; 423/337; 423/263; 502/525; 502/355; 501/123; 501/126; 501/152; 501/94; 501/1; 252/51
[58] Field of Search ............... 423/604, 636, 639, 337, 423/263, 593 C, 593; 502/525, 355; 501/123, 126, 152, 94; 252/51; 505/1

[56] References Cited

U.S. PATENT DOCUMENTS 4,804,649 2/1989 Sherif .................................. 423/263

OTHER PUBLICATIONS

Japanese Journal of Applied Physics, vol. 26, No. 5, May 1987, pp. L836–L837, Saito et al., "Superconductivity of Sr-La-Cu Oxides Prepared by Coprecipitation Method".
Materials and Processing Report, vol. 2, No. 10, 1988, pp. 1–9.
Proceeding of Symposium S of the 1987 Spring Meeting of Mat. Res. Soc., vol. EA-11, Morris et al., Mobile Oxygen and Isotope Effects in the High Temperature Superconductive YBa$_2$Cu$_3$O$_7$.
"Manufacture and Testing of HighTc–Superconducting Materials", Yarat et al., Advanced Ceramic Materials, vol. 2, No. 3B, 1987, pp. 372–379.
Advanced Ceramic Materials, vol. 2, No. 3B, 1987, Cina et al., "Powder Processing for Microstructural Control in Ceramic Superconductors", pp. 329–336.
Advanced Ceramic Materials, vol. 2, No. 3B, 1987, pp. 656–661, "Thermal Analysis of Ba$_2$YCu$_3$O$_{7-x}$ at 700°–1000° C. in Air", Cook et al.
Mat. Res. Soc. Symp. Proc., vol. 99, 1988, "Advantages of Barium Peroxide in the Powder Synthesis of Perovskite Super Conductors", pp. 615–618, Hepp et al.
Japanese Journal of Applied Physics, vol. 26, No. 55, 1987, pp. L736–737, Kawai et al., "Preparation of High-Tc Y–Ba–Cu–O Superconductor".
Japanese Journal of Applied Physics, vol. 26, No. 5, 7-1987, pp. L1159–L1160, Fujiki et al., "Preparation of a High-Tc Y-Ba-Cu-O Superconductor using Calodial Method".
Z. Phys. B Condensed Matt. 64, 189–193, 1986, Bednorz et al., "Possible High Tc Superconductivity in the Ba-La-Cu-O System".
Materials Research Society Symposium Proceedings, vol. 99, High Temperature Superconductors, Kayser et al., "Preparation of High Tc Y Ba$_2$Cu$_3$O$_{7-x}$ Ponders from Nitrate and Oxalate Precursors", 1988, pp. 159–164.
Materials Research Society Symposium Proceedings, vol. 99, High Temperature Superconductors, Voigt et al., "A Hydroxycarbonate Route to Superconductor Precursor Powders", 1988, pp. 635–638.
Japanese Journal of Applied Physics, vol. 26, No. 5, May 1987, "Single Crystal Preparation of Ba$_2$YCu$_3$Ox from NonStoichiometric Melts", Takekaw et al., L 851–853.
Japanese Journal of Applied Physics, vol, 26, No. 4, Apr. 1987, pp. L498–501, "X-Ray and Electron Microscopic Study of a High Temperature Superconductor, etc.".
Chemistry of High Temperature Superconductors, chapter 7, Davison et al., and Chapter 11, Holland et al., American Chemical Society, 1987, pp. 65–78 and 102–113.
Japanese Journal of Applied Physics, vol. 26, No. 5, May 1987, pp. L858–859.
Materials and Processing Report, "Update Report on High TC Superconductors", vol. 2, No. 4, Jul. 1987, pp. 1–4.

Primary Examiner—Robert L. Stoll
Assistant Examiner—Paige C. Harvey
Attorney, Agent, or Firm—Oblon, Spivak, McClelland, Maier & Neustadt

[57] ABSTRACT

A process for preparing compound metal oxides, a superconductive compound oxides for instance, is disclosed. The process comprises preparing an aqueous solution containing a predetermined content ratio of chloride, nitrate or acetate of a rare earth metal, an alkaline earth metal and copper, slightly basifying the solution to form hydroxides of the rare earth metal and copper and then introducing carbon dioxide to form carbonate of the alkaline earth metal, collecting the thus formed mixed precipitate of hydroxides and carbonate and firing it.

9 Claims, No Drawings

PROCESS FOR PREPARING COMPOUND METAL OXIDES

FIELD OF THE INVENTION

This invention relates to a process for preparing compound metal oxides using specific chemical steps therefor. More specifically, this invention relates to a specific process for preparing compound metal oxides of specific compositions which are useful as superconductor materials, oxygen sensors, catalysts, etc. Especially, compound metal oxides of a rare earth metal, an alkaline earth metal and copper have recently drawn attention as superconductor materials which exhibit superconductivity at temperatures over 77K.

BACKGROUND OF THE INVENTION

As methods for preparing compound metal oxides, there have been processes in which (1) Oxides, carbonates or oxalates of the respective component metals are physically mixed in the state of powder, the mixture is fired and pulverized;

(2) Water-soluble salts such as nitrates of the respective components metals are dissolved in water to make a homogeneous solution, the metals are coprecipitated as insoluble oxalates by addition of oxalate ions, and the precipitate is collected and fired into a compound metal oxide, etc.

In process (1), powders are mixed and fired. Therefore, the reaction proceeds from the contact boundaries of the powder particles and there remain some unreacted portions. Thus the product often deviates in compositions from that intended.

In process (2), the condition of precipitation differs from metal to metal, and, therefore, a precipitate containing a rare earth metal, an alkaline earth metal and copper, for instance, in the content ratio exactly the same as the content ratio in the solution is not always formed. Therefore, compound metal oxides of compositions different from that intended are inevitably formed.

In process (2), a method in which precipitation of oxalate by addition of oxalate ions is caused at the pH of around 5 is preferably employed. Even in this method, however, sometimes compound metal oxides the composition of which deviates by several tens % from the intended composition are produced, and thus a compound metal oxide of the intended composition cannot be produced regularly and reproducibly.

This invention relates to an improvement of the above-described conventional coprecipitation process. Disadvantages of conventional coprecipitation processes are diminished by slightly basifying a solution containing a predetermined content ratio of chlorides, nitrates or acetates of a rare earth metal, an alkaline earth metal and copper to form hydroxides of the rare earth metal and copper at first, and then introducing carbon dioxide gas into the thus formed suspension to form carbonate of the alkaline earth metal, that is, by forming a mixture of hydroxides of the rare earth metal and copper and carbonate of the alkaline earth metal.

SUMMARY OF THE INVENTION

This invention provides a process for preparing a compound metal oxide of a rare earth metal, an alkaline earth metal and copper of a specific composition comprising preparing an aqueous solution containing a predetermined content ratio of chloride, nitrate or acetate of a rare earth metal, an alkaline earth metal and copper, said content ratio corresponding to the composition of the object coumpound metal oxide, adjusting the pH of the solution to 6–9 to form a fine precipitate of hydroxides of the rare earth metal and copper at first, causing it to form a suspension and thereafter introducing carbon dioxide gas into the suspension to form a fine homogeneous copresipitate of alkaline earth metal carbonate, rare earth metal hydroxide and copper hydroxide, and collecting the coprecipitate and firing it. Preferably, the introduction of carbon dioxide gas is carried out while the pH of the suspension is maintained at 6.5–7.5 and the temperature is kept at 0°–20° C. Lower temperatues are preferred because finer particles are obtained.

In the present invention, the term "rare earth metal" means Sc, Y, La, Ce, Pr, Nd, Pm, Sm, Eu, Gd, Tb, Dy, Ho, Er, Tm, Yb and Lu.

In the present invention, the term "alkaline earth metal" means Be, Mg, Ca, Sr and Ba.

The process of the present invention is carried out as follows. A mixed solution containing chloride, nitrate or acetate of a rare earth metal, an alkaline earth metal and copper in a predetermined content ratio is prepared, wherein the concentrations of the salts must be adjusted so that none of them deposit. After the salts are completely dissolved, the pH of the solution is adjusted to 6–9 so as to precipitate hydroxides of copper and the rare earth metal. The solution containing the precipitate is thoroughly stirred with the pH maintained, and carbon dioxide gas is blown into the suspension so that fine bubbles are formed. Thus a fine alkaline earth metal carbonate precipitate is formed. The adjustment of the pH is preferably effected with ammonia or an organic amine. At a pH of less than 6, precipitation of rare earth metal and copper is insufficient. At a pH higher than 9, precipitation of copper is again poor.

The formed precipitate is collected and fired. Preferably firing is carried out as follows. The collected precipitate is compacted and the compact is calcined at a temperature of 400°–900° C. and roasted under an oxygen partial pressure of at least the same as that in air or higher. Thus the desired compound oxide is obtained.

The point of the present invention does not reside in the step of firing but in the step of precipitation.

By the process of the present invention, compound metal oxides the compositions of which are less deviated from the intended composition than the conventional process can be obtained.

SPECIFIC DESCRIPTION OF THE INVENTION

The process of the present invention and the use of the products thereof are explained by way of working examples.

EXAMPLE 1

5.651 g of $Y_2O_3$ (99.99% purity)
19.754 g of $BaCO_3$ (99.9% purity) and
11.943 g of CuO (99.9% purity)
were dissolved in 30 ml of concentrated nitric acid, and the solution was diluted to 1 liter. The solution was kept at 20° C., and the pH of the solution was adjusted to 7 with ammoniacal water so that the first step precipitation occurred. Then, 99.9% pure carbon dioxide gas was blown into the suspension for 30 minutes at the rate of 500 ml/min. so that the second step precipitation occurred. During the bubbling of carbon dioxide gas, the pH of the suspension was maintained at 7, and the temperature was kept at 20° C. The precipitate was collected by suction filtration and dried in vacuo at 50° C. for 15 hours. The obtained reaction product was calcined in an alumina boat at 900° C. for 5 hours in air. The obtained powder was compacted into pellets and fired at 930° C. for 10 hours. The fired powder was cooled in the furnace at the rate of 100° C./hr. The product was analyzed by X-ray diffraction analysis and was identified to be $YBa_2Cu_3O_{7-x}$ perovskite type compound, wherein x is a small fraction which represents deviation from the stoichiometric relation but cannot be specified for the time being. Three 0.2 g samples were taken from the product and were chemically analyzed. The results are indicated in Table 1.

TABLE 1

| Sample No. | (Molar Ratio) | | |
|---|---|---|---|
| | Y | Ba | Cu |
| 1 | $1.00_2$ | $2.00_1$ | 3 |
| 2 | $0.99_9$ | $2.00_0$ | 3 |
| 3 | $1.00_1$ | $1.99_9$ | 3 |

The product was also observed under a scanning electron microscope. The particle size was 0.1–0.2μ.

The electric conductivity of the thus obtained pellets were measured while chilled with liquid nitrogen. The electric resistance sharply dropped from 96K. and it became zero at 94K.

COMPARATIVE EXAMPLE 1

The same aqueous solution as used in Example 1 was prepared and the pH of the solution was adjusted to 5.5 to form a precipitate and thereafter barium carbonate by introduction of carbon dioxide. The obtained precipitate was calcined, and roasted into a compound metal oxide. However, precipitation of yttrium was poor and the Y:Ba:Cu ratio was 0.4:2:2, and the compound oxide did not exhibit superconductivity.

COMPARTIVE EXAMPLE 2

The same aqueous solution as used in Example 1 was prepared and the pH of the solution was adjusted to 9.5 to form a precipitate. Thereafter carbonate was formed by introduction of carbon dioxide. The obtained precipitate was calcined, and roasted into a compound metal oxide. However, copper did not precipitate and the composition of the resulting compound was Y:Ba:Cu=1.0:2.65:0. The compound did not exhibit superconductivity.

We claim:

1. A process for preparing a compound metal oxide of a rare earth metal, an alkaline earth metal, and copper, comprising:
   (i) adjusting the pH of an aqueous solution of (a) one member selected from the group consisting of a rare earth metal chloride, a rare earth metal nitrate, and a rare earth metal acetate, (b) one member selected from the group consisting of an alkaline earth metal chloride, an alkaline earth metal nitrate, and an alkaline earth metal acetate, and (c) one member selected from the group consisting of copper chloride, copper nitrate, and copper acetate to a pH of 6 to 9, to obtain a suspension of a fine precipitate of a rare earth metal hydroxide and copper hydroxide;
   (ii) introducing carbon dioxide gas into said suspension, to obtain a fine homogeneous coprecipitate of an alkaline earth metal carbonate, a rare earth metal hydroxide, and copper hydroxide;
   (iii) collecting said coprecipitate, to obtain a collected precipitate; and
   (iv) firing said collected precipitate.

2. The process for preparing a compound metal oxide of a rare earth metal, an alkaline earth metal and copper as claimed in claim 1, wherein said introducing carbon dioxide step is conducted with the pH of the suspension maintained at 6.5–7.5 and the temperature thereof is kept at not higher than 20° C.

3. The process of claim 1, wherein said aqueous solution is prepared by dissolving an oxide of a rare earth metal, a carbonate of an alkaline earth metal, and copper oxide in an acid.

4. The process of claim 3, wherein said acid is nitric acid.

5. The process of claim 1, wherein said adjusting the pH step (i) is carried out by adding ammonia.

6. The process of claim 1, wherein said adjusting the pH step is carried out by adding an organic amine.

7. The process of claim 1, wherein said firing comprises compacting said collected precipitate, to obtain a compact; calcining said compact, to obtain a calcined compact; and roasting said calcined compact.

8. The process of claim 7, wherein said calcining is conducted at a temperature of from 400° to 900° C.

9. The process of claim 7, wherein said roasting is conducted in an atmosphere with an oxygen partial pressure of at least that of air.

* * * * *